(12) United States Patent
Vincent

(10) Patent No.: US 10,572,087 B2
(45) Date of Patent: Feb. 25, 2020

(54) SELF-CAPACITENCE SENSOR AND SENSOR ARRAY SENSITIVITY CALIBRATION METHOD USING SECONDARY MUTUAL CAPACITENCE MEASUREMENTS

(71) Applicant: Cirque Corporation, Salt Lake City, UT (US)

(72) Inventor: Paul Vincent, Kaysville, UT (US)

( * ) Notice: Subject to any disclaimer, the term of this patent is extended or adjusted under 35 U.S.C. 154(b) by 0 days.

(21) Appl. No.: 16/046,609

(22) Filed: Jul. 26, 2018

(65) Prior Publication Data

US 2019/0034004 A1    Jan. 31, 2019

Related U.S. Application Data

(60) Provisional application No. 62/537,862, filed on Jul. 27, 2017.

(51) Int. Cl.
*G06F 3/044* (2006.01)
*H03K 17/96* (2006.01)
*G06F 3/041* (2006.01)

(52) U.S. Cl.
CPC ............ *G06F 3/044* (2013.01); *G06F 3/0416* (2013.01); *H03K 17/962* (2013.01); *G06F 2203/04103* (2013.01); *G06F 2203/04106* (2013.01); *G06F 2203/04108* (2013.01); *H03K 2217/960705* (2013.01)

(58) Field of Classification Search
CPC .................. G06F 3/044; G06F 3/0416; G06F 2203/04103; G06F 2203/04106; G06F 2203/04108; H03K 17/962; H03K 2217/96705
See application file for complete search history.

(56) References Cited

U.S. PATENT DOCUMENTS

| | | | |
|---|---|---|---|
| 2013/0181942 A1 | 7/2013 | Bulea et al. | |
| 2014/0240280 A1* | 8/2014 | Ekici | G06F 3/044 345/174 |
| 2015/0237183 A1 | 8/2015 | Novet | |
| 2015/0301646 A1 | 10/2015 | Caldwell et al. | |
| 2016/0154507 A1* | 6/2016 | Bharathan | G06F 3/011 345/174 |
| 2017/0090599 A1* | 3/2017 | Kuboyama | G06F 3/038 |
| 2018/0264357 A1* | 9/2018 | Dalton | A63F 13/24 |
| 2018/0284922 A1* | 10/2018 | Teranishi | G06F 3/047 |

OTHER PUBLICATIONS

International Searching Authority; International Search Report and Written Opinion; PCT/US2018/044008; dated Oct. 10, 2018.

* cited by examiner

*Primary Examiner* — Christopher J Kohlman

(57) ABSTRACT

Systems and methods are disclosed for using a combination of mutual and self-capacitance sensors to determine when an object, such as a finger, has made contact with a controller, regardless of the size of the object.

28 Claims, 4 Drawing Sheets

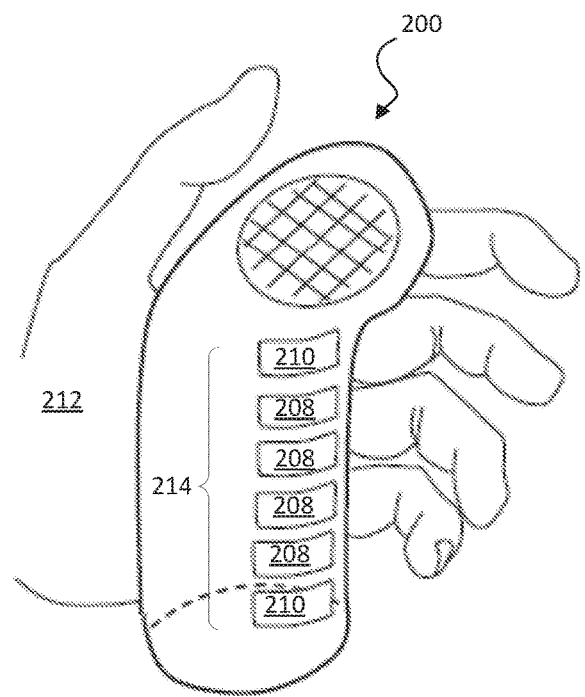
FIGURE 4A
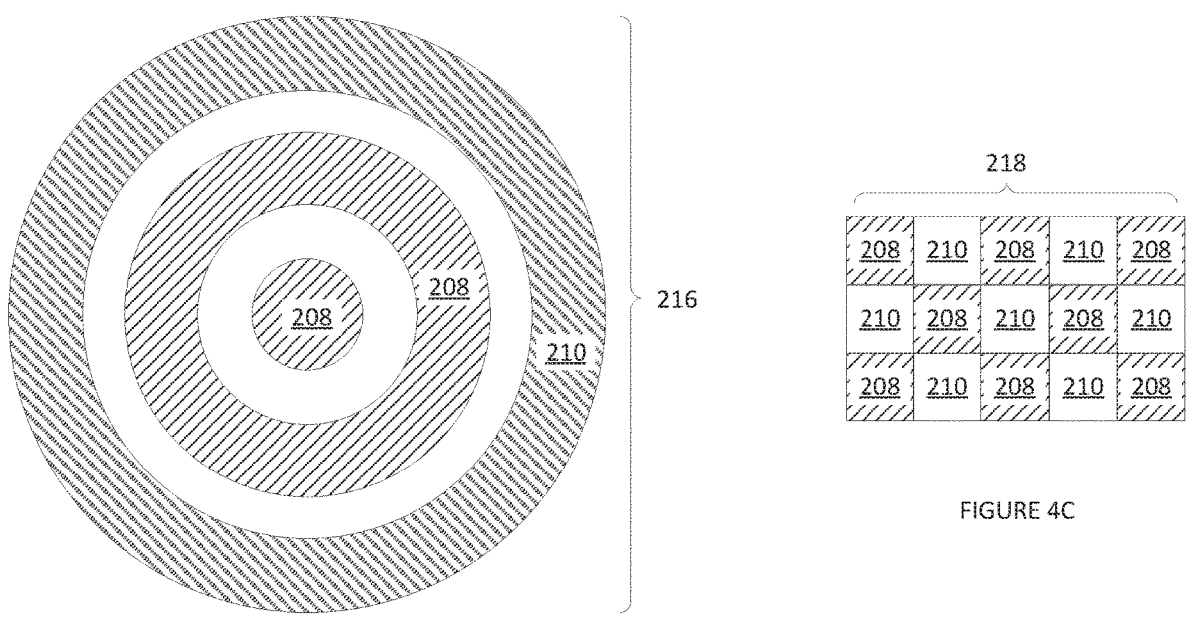
FIGURE 4B
FIGURE 4C

SELF-CAPACITENCE SENSOR AND SENSOR ARRAY SENSITIVITY CALIBRATION METHOD USING SECONDARY MUTUAL CAPACITENCE MEASUREMENTS

CROSS-REFERENCE TO RELATED APPLICATIONS

This application, under 35 U.S.C. § 119, claims the benefit of U.S. Provisional Patent Application Ser. No. 62/537,862 filed on Jul. 27, 2017, and entitled "SELF-CAPACITENCE SENSOR AND SENSOR ARRAY SENSITIVITY CALIBRATION METHOD USING SECONDARY MUTUAL CAPACITENCE MEASUREMENTS," the contents of which are hereby incorporated by reference herein.

FIELD OF THE DISCLOSURE

This disclosure relates generally to proximity sensors. More specifically, the disclosure relates to a system and method for determining touchdown of a finger on a hand controller by using a combination of self-capacitance and mutual capacitance sensors.

BACKGROUND

There are several designs for touch sensor which may be adapted for use in the presently disclosed embodiments. It is useful to examine the underlying technology of the touch sensors to better understand how any touchpad can take advantage of the presently disclosed embodiments.

The CIRQUE® Corporation touchpad is a mutual capacitance-sensing device and an example is illustrated as a block diagram in FIG. 1. In this touchpad 10, a grid of X (12) and Y (14) electrodes and a sense electrode 16 are used to define the touch-sensitive area 18 of the touchpad. Typically, the touchpad 10 is a rectangular grid of approximately 16 by 12 electrodes, or 8 by 6 electrodes when there are space constraints. Interlaced with these X (12) and Y (14) (or row and column) electrodes is a single sense electrode 16. All position measurements are made through the sense electrode 16.

The CIRQUE® Corporation touchpad 10 measures an imbalance in electrical charge on the sense line 16. When no pointing object is on, or in proximity to, the touchpad 10, the touchpad circuitry 20 is in a balanced state, and there is no charge imbalance on the sense line 16. When a pointing object creates imbalance because of capacitive coupling when the object approaches or touches a touch surface (the sensing area 18 of the touchpad 10), a change in capacitance occurs on the electrodes 12, 14. What is measured is the change in capacitance, but not the absolute capacitance value on the electrodes 12, 14. The touchpad 10 determines the change in capacitance by measuring the amount of charge that must be injected onto the sense line 16 to reestablish or regain balance of charge on the sense line.

The system above is utilized to determine the position of a finger on, or in proximity to, a touchpad 10 as follows. This example describes row electrodes 12, and is repeated in the same manner for the column electrodes 14. The values obtained from the row and column electrode measurements determine an intersection which is the centroid of the pointing object on or in proximity to the touchpad 10.

In a first step, a first set of row electrodes 12 are driven with a first signal from P, N generator 22, and a different but adjacent second set of row electrodes are driven with a second signal from the P, N generator. The touchpad circuitry 20 obtains a value from the sense line 16 using a mutual capacitance measuring device 26 that indicates which row electrode is closest to the pointing object. However, the touchpad circuitry 20 under the control of microcontroller 28 cannot yet determine on which side of the row electrode the pointing object is located, nor can the touchpad circuitry 20 determine just how far the pointing object is located away from the electrode. Thus, the system shifts by one electrode the group of electrodes 12 to be driven. In other words, the electrode on one side of the group is added, while the electrode on the opposite side of the group is no longer driven. The new group is then driven by the P, N generator 22 and a second measurement of the sense line 16 is taken.

From these two measurements, it is possible to determine on which side of the row electrode the pointing object is located, and how far away. For example, by using a routine or program that compares the magnitude of the two signals measured, and then performs pointing object position determination.

The sensitivity or resolution of the CIRQUE® Corporation touchpad is much higher than the 16 by 12 grid of row and column electrodes implies. The resolution is typically on the order of 960 counts per inch, or greater. The exact resolution is determined by the sensitivity of the components, the spacing between the electrodes 12, 14 on the same rows and columns, and other factors that are not material to the present disclosure. The process above is repeated for the Y or column electrodes 14 using a P, N generator 24

Although the CIRQUE® touchpad described above uses a grid of X and Y electrodes 12, 14 and a separate and single sense electrode 16, the sense electrode can also be the X or Y electrodes 12, 14 by using multiplexing.

Self-capacitive sensors are also known to those skilled in the art. When a sensor uses self-capacitance to measure proximity of an object to the self-capacitive sensor, it may be difficult to tell the difference between a large object at a far range and a smaller object that is at a closer range when each of these two scenarios has a similar capacitive loading on the self-capacitive sensor. For example, on a particular virtual reality controller (e.g., the VR GRIP™ by Cirque Corporation), it may be difficult to determine if a finger is extended above a sensor of the VR controller, or if a finger is actually in contact because of the various sizes of fingers that may be used. Accordingly, it would be an advantage over the state of the art in proximity controllers to provide a controller that would be able to able to determine when contact is made by a finger.

Other drawbacks, disadvantages, and issues also exist with current systems and methods.

SUMMARY

In a first embodiment, a system and method for using a combination of different types of capacitive sensors to determine when a finger has made contact with a controller, regardless of the size of the finger are disclosed.

Accordingly, disclosed embodiments include a system for a graspable controller, having a grip portion, configured to be graspable by a hand, and an array of sensors located in the grip portion. The array may include a first self-capacitance sensor, a first mutual capacitance sensor, and a second mutual capacitance sensor located on either side of the first self-capacitance sensor. In some embodiments, the array of sensors is arranged in a linear array. In further embodiments, the linear array further has a first end and a second end, and the first mutual capacitance sensor is located at the first end and the second mutual capacitance sensor is located at the second end. In still further embodiments, the sensor array is arranged in a vertical linear array, or is arranged in a horizontal linear array.

In another disclosed embodiment, a second self-capacitance sensor is located adjacent to the first self-capacitance sensor, and both the first self-capacitance sensor and the second self-capacitance sensor are located between the first mutual capacitance sensor and the second mutual capacitance sensor. In a further embodiment, the array of sensors is arranged in a linear array having a first end and a second end, and the first mutual capacitance sensor is located at the first end and the second mutual capacitance sensor is located at the second end. In still further embodiments, the sensor array is arranged in a vertical linear array, or is arranged in a horizontal linear array. In still further embodiments, the first self-capacitance sensor and the second self-capacitance sensor are arranged one on top of the other on a vertical axis further comprising a left side and a right side, and the first mutual capacitance sensor comprises an elongated sensor located on the left side of the vertical axis, and the second mutual capacitance sensor comprises an elongated sensor located on the right side of the vertical axis.

In other disclosed embodiments, the self-capacitance sensor further comprises a segmented sensor.

Also disclosed are methods for manufacturing a graspable controller having a grip portion configured to be graspable by a hand. Embodiments of the method include locating an array of sensors in the grip portion. Embodiments of the array include a first self-capacitance sensor, a first mutual capacitance sensor, and a second mutual capacitance sensor. Embodiments of the method further include locating the first mutual capacitance sensor and the second mutual capacitance sensor on either side of the first self-capacitance sensor.

In further embodiments, the array further is a linear array comprising first end and a second end and the method includes locating the first mutual capacitance sensor at the first end and locating the second mutual capacitance sensor at the second end. In still further embodiments, the method includes arranging the sensor array in a vertical linear array, or arranging the sensor array in a horizontal linear array. In further embodiments, the method includes locating a second self-capacitance sensor adjacent to the first self-capacitance sensor and locating both the first self-capacitance sensor and the second self-capacitance sensor between the first mutual capacitance sensor and the second mutual capacitance sensor.

Other disclosed embodiments include a sensor system having a first mutual capacitance sensor having an inner side and an outer side, a second mutual capacitance sensor having an inner side and an outer side, and a first self-capacitance sensor located proximate to the inner side of the first mutual capacitance sensor and proximate to the inner side of the second mutual capacitance sensor. In further embodiments, the sensor system includes a second self-capacitance sensor located adjacent to the first self-capacitance sensor, and the first self-capacitance sensor is located proximate to the inner side of the first mutual capacitance sensor; and the second self-capacitance sensor is located proximate to the inner side of the second mutual capacitance sensor. In still further embodiments, the first mutual capacitance sensor, the first self-capacitance sensor, the second self-capacitance sensor, and the second mutual capacitance sensor are arranged along a vertical axis.

Other disclosed embodiments include a touch sensor system having one or more self-capacitance sensors, one or more mutual capacitance sensors located proximate to the one or more self-capacitance sensors, and the one or more mutual capacitance sensors are configured to measure mutual capacitance for objects close to the one or more self-capacitance sensors. In further embodiments, the one or more self-capacitance sensors and the one or more mutual capacitance sensors are arranged in a linear array, a concentric array, or a multi-dimensional array.

Other disclosed embodiments include a touch sensor system having an array of a plurality of dual mode capacitance sensors wherein at least two of the dual mode capacitance sensors are configured to detect mutual capacitance. In further embodiments, the array of the plurality of dual mode capacitance sensors is a linear array, a concentric array, or a multi-dimensional array.

Other embodiments are also disclosed.

These and other objects, features, advantages and alternative aspects of the present invention will become apparent to those skilled in the art from a consideration of the following detailed description taken in combination with the accompanying drawings.

BRIEF DESCRIPTION OF THE DRAWINGS

FIG. 4A is another embodiment showing another position of the sensors disposed in a vertical manner on a controller.

FIG. 4B is another embodiment showing another configuration of the sensors disposed in a circular array.

FIG. 4C another embodiment showing another configuration of the sensors disposed in a checkerboard array.

Figure 1:
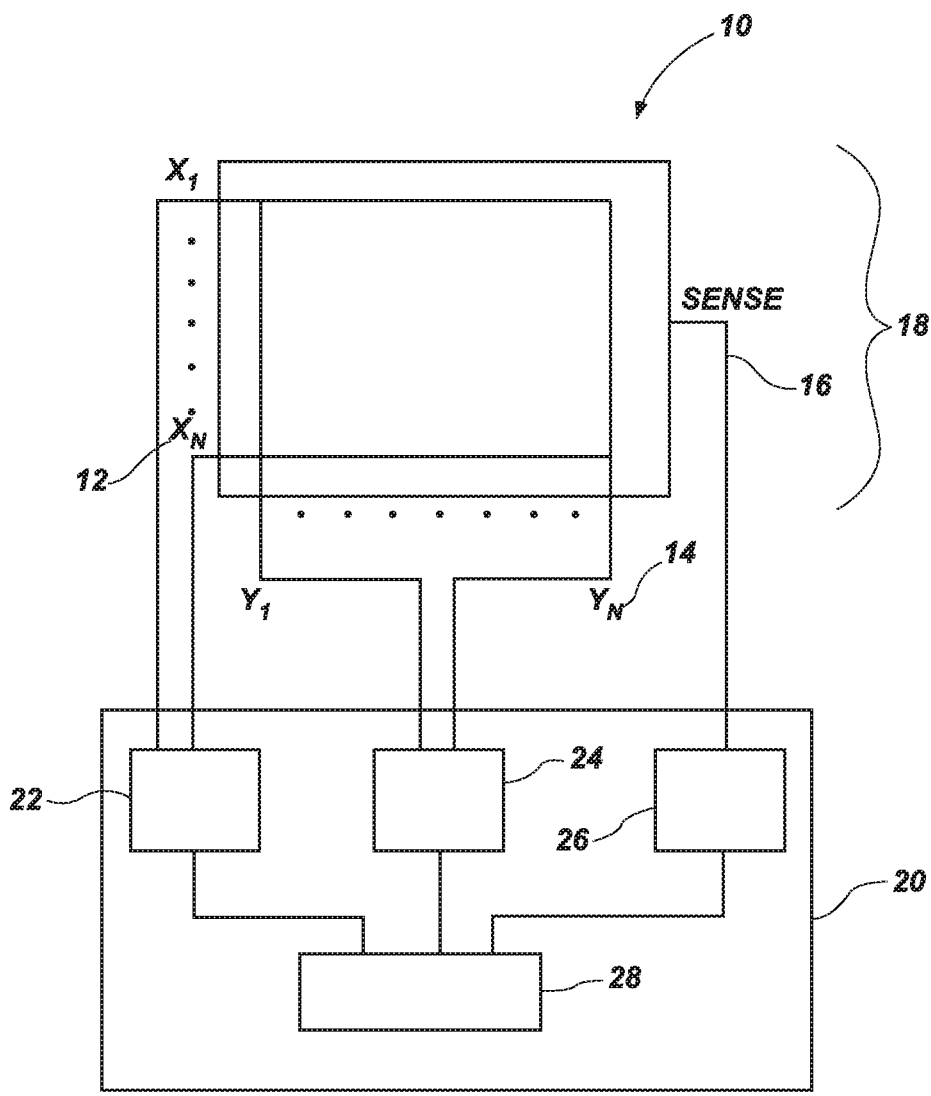
FIG. 1 is a block diagram that illustrates a prior art touch sensor design that may be modified in accordance with disclosed embodiments.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the spirit and scope of the invention as defined by the appended claims.

DETAILED DESCRIPTION

It should be understood that use of the term "touch sensor" throughout this document may be used interchangeably with "capacitive touch sensor," "capacitive sensor," "capacitive touch and proximity sensor," "proximity sensor," "touch and proximity sensor," "touch panel," "touchpad," and "touch screen."

It should also be understood that, as used herein, the terms "vertical," "horizontal," "lateral," "upper," "lower," "left," "right," "inner," "outer," etc., can refer to relative directions or positions of features in the disclosed devices and/or assemblies shown in the Figures. For example, "upper" or "uppermost" can refer to a feature positioned closer to the top of a page than another feature. These terms, however, should be construed broadly to include devices and/or assemblies having other orientations, such as inverted or inclined orientations where top/bottom, over/under, above/below, up/down, and left/right can be interchanged depending on the orientation.

Disclosed embodiments overcome the shortcoming of only using the detection of capacitive loading of a self-capacitance sensor in order to determine when an object such as a finger makes contact with a controller. In other words, disclosed embodiments are able to more accurately perform proximity tracking of an object as it approaches a sensor, regardless of the size and therefore the capacitive loading that the object may cause.

As one of ordinary skill in the art having the benefit of this disclosure would recognize, the relationship of sensitivity versus the distance an object is away from a sensor drops off exponentially faster with mutual capacitance measurements as compared to self-capacitance measurements. Thus, disclosed embodiments employ mutual capacitance measurements to differentiate a "touch," rather than self-capacitance measurements that detect object proximity. The mutual-capacitance information is used to detect touch and helps correlate a maximum value for self-capacitance proximity measurements.

One disclosed embodiment is directed to using a mutual capacitance sensor 210 that is in proximity to a self-capacitance sensor 208 to perform improved proximity detection and tracking of an object as it approaches the surface of a controller 200.

Figure 2:
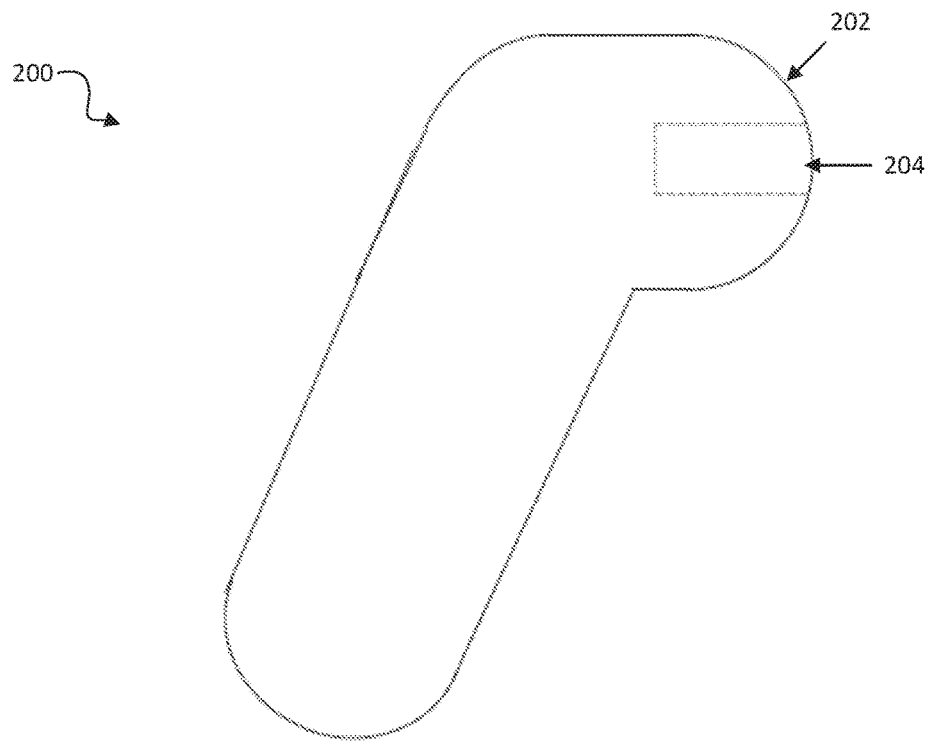
FIG. 2 is a perspective view of a controller that may be used in an embodiment, with a possible position of a sensor array on the grip of a controller.

In a first embodiment, a controller 200 may include a grip 202 where a hand 212 holds the grip 202. An example of a controller 200 is shown in FIG. 2. It should be understood that the controller 200 is only an example, and any style controller 200 may be used. As one of ordinary skill in the art having the benefit of this disclosure would recognize, objects other than a hand 212 or finger, such as a stylus, pen, wand, or the like, or other conductive objects, may be detected for proximity and touch. Further, as would also be recognized, other objects such as gasses, liquids, or any other substance that changes the permittivity or conductivity of the space being sensed may also be detected.

Furthermore, it should be understood that while embodiments may be applicable to three-dimensional sensors, finger grip sensors, proximity or hover applications, they may be applied to any application where proximity detection, or proximity distance tracking may be desired.

FIG. 2 also provides a schematic illustration for a location 204 of a three-dimensional grip 202 surface on the controller 200. The grip 202 (or trigger) location 204 is schematically shown as an outline using the dotted lines to indicate where sensors may be placed in the controller 200. As one of ordinary skill in the art having the benefit of this disclosure would recognize, a finger (e.g., from a user's hand 212) may cause the same capacitive loading on a self-capacitance sensor 208 in the grip 202 when it is not in contact with the grip 202, as when it is in contact with the grip 202, because fingers may be different sizes, and, therefore, cause very different capacitive loading. Therefore, it may be difficult to determine the difference between self-capacitance measurements for a finger that is positioned at a distance from the grip 202 and a finger that has made contact with, or made "touchdown" on, the grip 202.

As one of ordinary skill in the art having the benefit of this disclosure would recognize, disclosed embodiments exploit the difference in field strength versus proximity for self-capacitance and mutual-capacitance measurements. A mutual-capacitance sensor 210 may be designed to have significantly lower sensitivity versus distance than a self-capacitance sensor 208. In this way, a mutual-capacitance sensor 210 may be better able to determine when an object is touching the grip 202.

Figure 3:
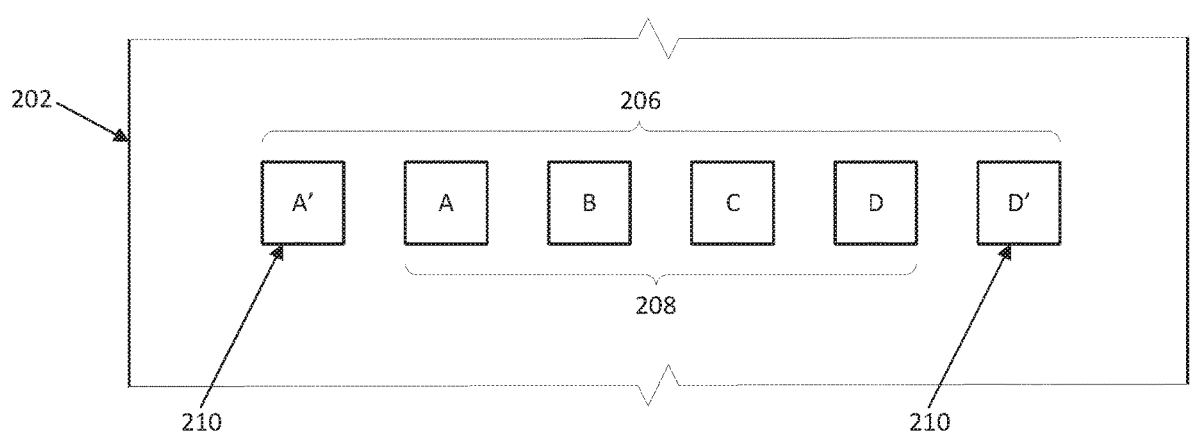
FIG. 3 is a close-up, schematic illustration of the position of mutual capacitance and self-capacitance sensors in a disclosed embodiment.

An embodiment shown in FIG. 3 shows at least a portion of the grip 202 of the controller 200 shown as a linear sensor 206, wherein ABCD may represent self-capacitance sensors 208. A mutual-capacitance sensor 210 (A' and D') is disposed at each end of the self-capacitance sensor array 208. The mutual capacitance sensors 210 (at A' and D') may be able to detect when a finger is touching the linear sensor array 206 and this information may be used to set the threshold limits (e.g., dynamic range) for the corresponding self-capacitance sensor 208 measurements.

In another embodiment, the mutual capacitance sensors 210 (at A' and D') may be left off and self-capacitance sensors 208 (at A and D) are used to perform mutual capacitance measurements in order to reduce the overall number of sensor elements in the linear array 206 and corresponding electrodes required to perform the measurements. In still another embodiment, the sensors 208, 210 may be dual-mode sensors that can be switched between self-capacitance detection mode and mutual capacitance detection mode.

FIG. 4A is another embodiment showing another configuration of the mutual capacitance sensors 210 and self-capacitance sensors 208 disposed in a vertical array 214 on a controller 200. As one of ordinary skill in the art having the benefit of this disclosure would recognize, depending on, among other things, the type of controller 200, other shapes, arrangements, and configurations of mutual capacitance sensors 210 and self-capacitance sensors 208 may also be used. For example, FIG. 4B is another embodiment showing another configuration of the mutual capacitance sensors 210 and self-capacitance sensors 208 disposed in a concentric array 216 and FIG. 4C another embodiment showing another configuration of the mutual capacitance sensors 210 and self-capacitance sensors 208 disposed in a multi-dimensional array 218. The arrangements of sensors shown in FIGS. 4A-4C are merely illustrative and fewer, or more, sensors may be used, as well as different shapes, sizes, may be used, and the positions of self-capacitance sensors 208 and mutual capacitance sensors 210 may be swapped, different arrays, such as multi-layer orthogonal linear arrays (X-Y grid), 3D Printed cube/pyramid, radial hub and spoke, etc., or the like may be used.

Figure 5:
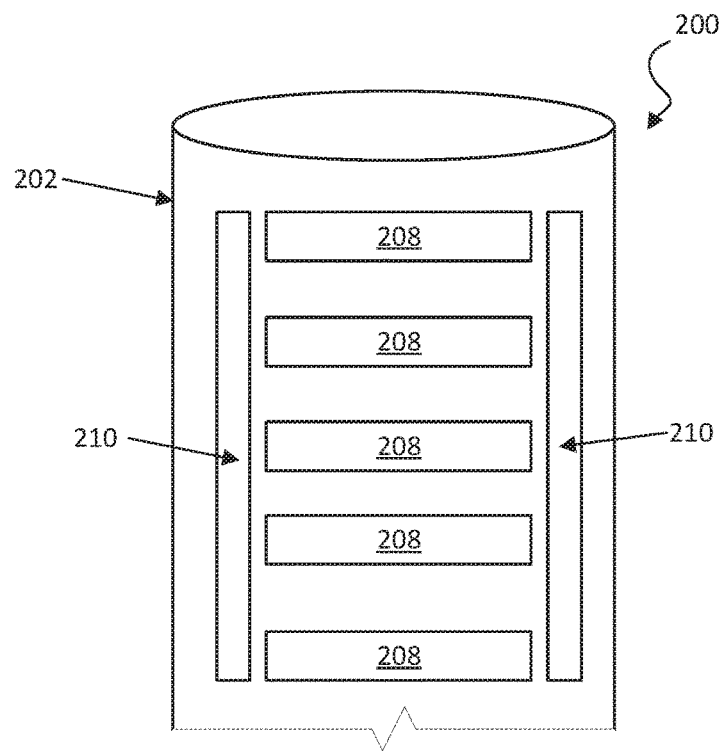
FIG. 5 is a schematic representation of another embodiment of a controller in accordance with this disclosure.

FIG. 5 is a schematic representation of another embodiment of a controller 200 in accordance with this disclosure. This embodiment is an example of using a single self-capacitance sensor 208 per finger (e.g., five total) and using the mutual-capacitance sensors 210 to detect which side of grip 202 is initially in contact with the finger extended (e.g., palm side of hand 212 (not shown in FIG. 5)) and which side comes into contact with the finger closed (e.g., a fingertip). Other numbers, configurations, and arrangements of sensors 208, 210 are also possible.

Figure 6:
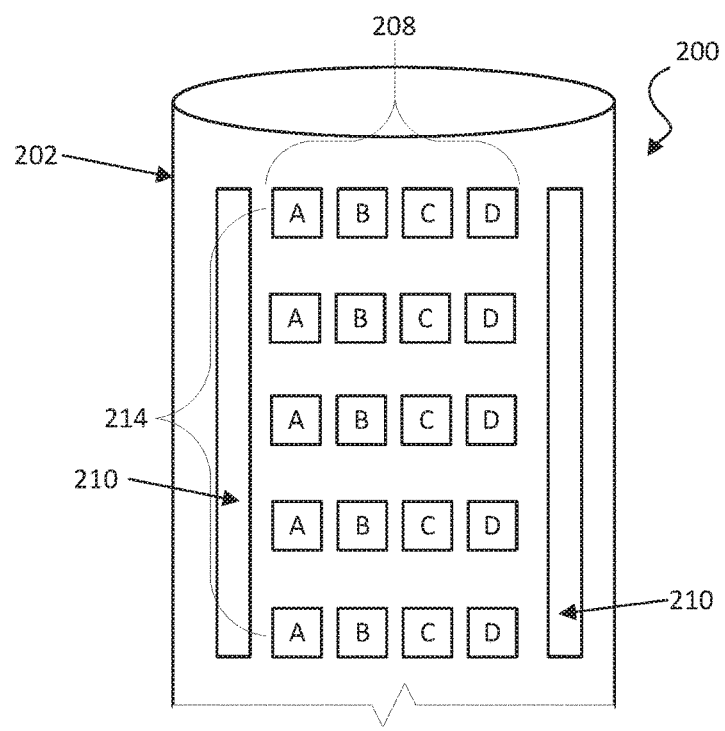
FIG. 6 is a schematic representation of another embodiment of a controller in accordance with this disclosure.

FIG. 6 is a schematic representation of another embodiment of a controller 200 in accordance with this disclosure. As shown, sensors may be arranged in multiple rows in a vertical array 214 of multiple segment (A, B, C, D) self-capacitance sensors 208. The self-capacitance sensor 208 segments (A, B, C, D) are arranged horizontally to measure the proximity of a finger, while multiple rows are arranged vertically in array 214 to measure multiple fingers simultaneously. While five rows of four segments are shown, other numbers, configurations, and arrangements of segments, rows, and columns, may also be used. Similarly, while two elongated mutual capacitance sensors 210 are shown, other configurations, such as segmented mutual capacitance sensors 210, or other numbers of sensors 210 may be used.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed is:

1. A system for a graspable controller, the system comprising:
    a grip portion, configured to be graspable by a hand;
    an array of sensors located in the grip portion, the array further comprising:
        a first self-capacitance sensor; and
        a first mutual capacitance sensor and a second mutual capacitance sensor located on either side of the first self-capacitance sensor;
    wherein the graspable controller is configured to determine at least one value of a self-capacitance proximity measurement from a mutual capacitance measurement.

2. The system of claim 1 wherein the array of sensors is arranged in a linear array.

3. The system of claim 2 wherein the linear array further comprises a first end and a second end and wherein the first mutual capacitance sensor is located at the first end and the second mutual capacitance sensor is located at the second end.

4. The system of claim 3 wherein the sensor array is arranged in a vertical linear array.

5. The system of claim 3 wherein the sensor array is arranged in a horizontal linear array.

6. The system of claim 1 further comprising:
    a second self-capacitance sensor located adjacent to the first self-capacitance sensor, and wherein both the first self-capacitance sensor and the second self-capacitance sensor are located between the first mutual capacitance sensor and the second mutual capacitance sensor.

7. The system of claim 6 wherein the array of sensors is arranged in a linear array.

8. The system of claim 7 wherein the linear array further comprises a first end and a second end and wherein the first mutual capacitance sensor is located at the first end and the second mutual capacitance sensor is located at the second end.

9. The system of claim 8 wherein the sensor array is arranged in a vertical linear array.

10. The system of claim 8 wherein the sensor array is arranged in a horizontal linear array.

11. The system of claim 6 wherein the first self-capacitance sensor and the second self-capacitance sensor are arranged one on top of the other on a vertical axis further comprising a left side and a right side; and wherein,
    the first mutual capacitance sensor comprises an elongated sensor located on the left side of the vertical axis; and
    the second mutual capacitance sensor comprises an elongated sensor located on the right side of the vertical axis.

12. The system of claim 1 wherein the first self-capacitance sensor further comprises a segmented sensor.

13. A method for manufacturing a graspable controller comprising a grip portion configured to be graspable by a hand, the method comprising:
    locating an array of sensors in the grip portion, the array further comprising:
        a first self-capacitance sensor;
        a first mutual capacitance sensor; and
        a second mutual capacitance sensor; and locating the first mutual capacitance sensor and the second mutual capacitance sensor on either side of the first self-capacitance sensor;
    wherein the graspable controller is configured to determine at least one value of a self-capacitance proximity measurement from a mutual capacitance measurement.

14. The method of claim 13 wherein the array further comprises a linear array comprising first end and a second end and wherein the method further comprises:
    locating the first mutual capacitance sensor at the first end; and
    locating the second mutual capacitance sensor at the second end.

15. The method of claim 14 wherein the method further comprises arranging the sensor array in a vertical linear array.

16. The method of claim 14 wherein the method further comprises arranging the sensor array in a horizontal linear array.

17. The method of claim 13 further comprising:
    locating a second self-capacitance sensor adjacent to the first self-capacitance sensor; and
    locating both the first self-capacitance sensor and the second self-capacitance sensor between the first mutual capacitance sensor and the second mutual capacitance sensor.

18. A sensor system comprising:
    a first mutual capacitance sensor further comprising an inner side and an outer side;
    a second mutual capacitance sensor further comprising an inner side and an outer side;
    a first self-capacitance sensor located proximate to the inner side of the first mutual capacitance sensor and proximate to the inner side of the second mutual capacitance sensor;
    wherein the system is configured to determine at least one value of a self-capacitance proximity measurement from a mutual capacitance measurement.

19. The system of claim 18 further comprising:
    a second self-capacitance sensor located adjacent to the first self-capacitance sensor;
    wherein the first self-capacitance sensor is located proximate to the inner side of the first mutual capacitance sensor; and the second self-capacitance sensor is located proximate to the inner side of the second mutual capacitance sensor.

20. The system of claim 19 wherein the first mutual capacitance sensor, the first self-capacitance sensor, the second self-capacitance sensor, and the second mutual capacitance sensor are arranged along a vertical axis.

21. A touch sensor system comprising:
    one or more self-capacitance sensors;
    one or more mutual capacitance sensors located proximate to the one or more self-capacitance sensors, and wherein the one or more mutual capacitance sensors are configured to measure mutual capacitance for objects close to the one or more self-capacitance sensors;

wherein the touch sensor system is configured to determine at least one value of a self-capacitance proximity measurement from a mutual capacitance measurement.

22. The system of claim 21 wherein the one or more self-capacitance sensors and the one or more mutual capacitance sensors are arranged in a linear array.

23. The system of claim 21 wherein the one or more self-capacitance sensors and the one or more mutual capacitance sensors are arranged in a concentric array.

24. The system of claim 21 wherein the one or more self-capacitance sensors and the one or more mutual capacitance sensors are arranged in a multi-dimensional array.

25. A touch sensor system comprising:
an array of a plurality of dual mode capacitance sensors wherein at least two of the dual mode capacitance sensors are configured to detect mutual capacitance;
wherein the touch sensor system is configured to determine at least one value of a self-capacitance proximity measurement from a detected mutual capacitance measurement.

26. The system of claim 25 wherein the array of the plurality of dual mode capacitance sensors is a linear array.

27. The system of claim 25 wherein the array of the plurality of dual mode capacitance sensors is a concentric array.

28. The system of claim 25 wherein the array of the plurality of dual mode capacitance sensors is a multi-dimensional array.

* * * * *